United States Patent [19]
McMahon

[11] 4,291,976
[45] Sep. 29, 1981

[54] DIGITAL FIBER OPTIC POSITION SENSOR
[75] Inventor: Donald H. McMahon, Carlisle, Mass.
[73] Assignee: Sperry Corporation, New York, N.Y.
[21] Appl. No.: 128,614
[22] Filed: Mar. 10, 1980
[51] Int. Cl.³ .............................................. G01D 5/34
[52] U.S. Cl. .............................. 356/150; 250/231 SE; 250/227; 340/347 P
[58] Field of Search ............... 356/150, 152, 373, 375; 250/231 SE, 237 G, 227; 350/96.20; 340/347 P

[56] References Cited
U.S. PATENT DOCUMENTS
| | | | |
|---|---|---|---|
| 3,892,468 | 7/1975 | Duguay | 350/96.24 |
| 4,075,478 | 2/1978 | Walker | 250/231 SE |
| 4,110,610 | 8/1978 | Mueller et al. | 250/231 SE |
| 4,146,873 | 3/1979 | Yamanaka et al. | 340/347 P |
| 4,154,529 | 5/1979 | Dyott | 250/227 |
| 4,164,373 | 8/1979 | Schuss et al. | 356/316 |

*Primary Examiner*—R. A. Rosenberger
*Attorney, Agent, or Firm*—Howard P. Terry; Seymour Levine

[57] ABSTRACT

A self-clocking digital position sensor having a main optical transmission line to which are coupled a multiplicity of branch optical transmission lines each of which is for transmitting one bit of position data. The branch transmission lines may be of unequal length or sequentially coupled along the main transmission line to provide a position data sequence of optical pulses reflected from a position coded device at an end terminal of the main transmission line for each optical pulse incident thereto.

7 Claims, 6 Drawing Figures

DIGITAL FIBER OPTIC POSITION SENSOR

BACKGROUND OF THE INVENTION

1. Field of the Invention

The present invention relates to position sensors and more particularly to the digital representation of position with the utilization of fiber optic techniques.

2. Background of the Invention

Devices in the prior art for obtaining digital representation of angular rotation or linear displacement generally comprise transducers containing a coded pattern of conducting a non-conducting areas. Brushes in contact with this transducer will generate a one when in a conducting area and a zero when in a non-conducting area. These devices require complete electrical circuits for each bit in a generated code. Positional sensitivity for these systems is a function of the number of bits in the code, which in turn is limited by the size of the brushes. Increased sensitivity may be provided by utilizing a photoelectric encoder which comprises a disk with a multiplicity of concentric bands, or a multiplicity of parallel bands arranged in a rectangular fashion, wherein each band is divided into transparent and opaque segments. A light source is positioned on one side of the disk and photodetectors, or optical fibers leading to photodetectors, are arranged on the other side to position one photodetector, or optical fiber, in each band. When a transparent segment in a band is between the light source and the photodetector for that band, an electrical signal representative of a one will appear at the output terminal of the photodetector, and when an opaque segment is between the light source and the photodetector, an electrical signal representative of a zero will appear at the output terminal. This system requires as many detectors or optical fiber-detector combinations as there are bits in the coded signal. Both the electrical and optical systems require a multiplicity of data lines, as many as the number of data bits, to transmit the digital data to the processor. The present invention provides an optical analog-to-digital converter with which digital data is transmitted to a processor along a single, optical fiber without the necessity of providing electrical or optical energy at the encoder.

SUMMARY OF THE INVENTION

A fiber optic, digital position sensor constructed according to the principals of the present invention includes a main optical transmission line for the propagation of optical signal pulses that are incident thereto. In one embodiment each propagating optical pulse is directionally coupled to a star coupler wherefrom it is caused to propagate in a multiplicity of branch optical transmission lines of variable lengths. The length of each branch transmission line is made to be longer than its adjacent transmission line by a predetermined constant differential length. Optical pulses are emitted from the end terminals of the branch transmission lines to illuminate an angular position, or linear translation, encoder which is comprised of areas which reflect incident optical pulses with a selected one of two reflection coefficients. Each branch transmission line is for the illumination of one area and optical pulses incident thereto are reflected towards the emitting terminal with an intensity which depends upon the reflectivity of the area illuminated. The totality of reflected pulses form a binary coded sequence of pulses which propagate through the branch transmission lines and the main transmission line toward the input end of the main transmission line.

In a second embodiment of the invention the branch lines are directly coupled to the main transmission line with the coupling regions for each branch line spaced along the main optical transmission line to provide a desired time delay between the reflected pulses at the input terminal. Other features and advantages of the invention will become apparent from the following detailed description.

DESCRIPTION OF THE PREFERRED EMBODIMENT

The transmissions of a multiplicity of signals over a signal transmission line may be realized by sequentially coupling each signal to propagate along the transmission line for an assigned epoch during which other signals do not propagate. Since the velocity of propagation along the transmission line is constant for all similarly constituted signals, the established time separation between pulses is maintained during transit to the receiving station. If a multiplicity of branch transmission lines, each a different length and terminated with a reflecting device are coupled to a main transmission line in such a manner that a pulse signal propagating along the main transmission line is coupled to each of the multiplicity of branch transmission lines, the pulsed signals on each of the branch lines will propagate to the terminating reflecting device, be reflected therefrom, and returned to the main transmission line in a time sequence that is a function of differential lengths of the branch lines and the velocity of propagation therealong. Thus the finite signal propagation velocity on a transmission line may be utilized to achieve time division multiplexing without using electrically active components. Consider optical fibers along which light propagates at speeds $2 \times 10^8$ m/sec, each terminated with reflecting devices and each of different length with differential lengths that are substantially equal to 0.1 m. between adjacent transmission lines. Optical signals reflected from these devices may be resolved if an optical pulse with a $10^{-9}$ seconds duration (system bandwidth equal 1 GHz) is transmitted along the main fiber to be incident to each branch fiber. Optical signal resolution may be maintained and the pulse width increased (system bandwidth decreased) if the differential line lengths are increased, as for example, a differential line length of one meter will require a pulse of substantially $10^{-8}$ seconds duration.

Figure 1:
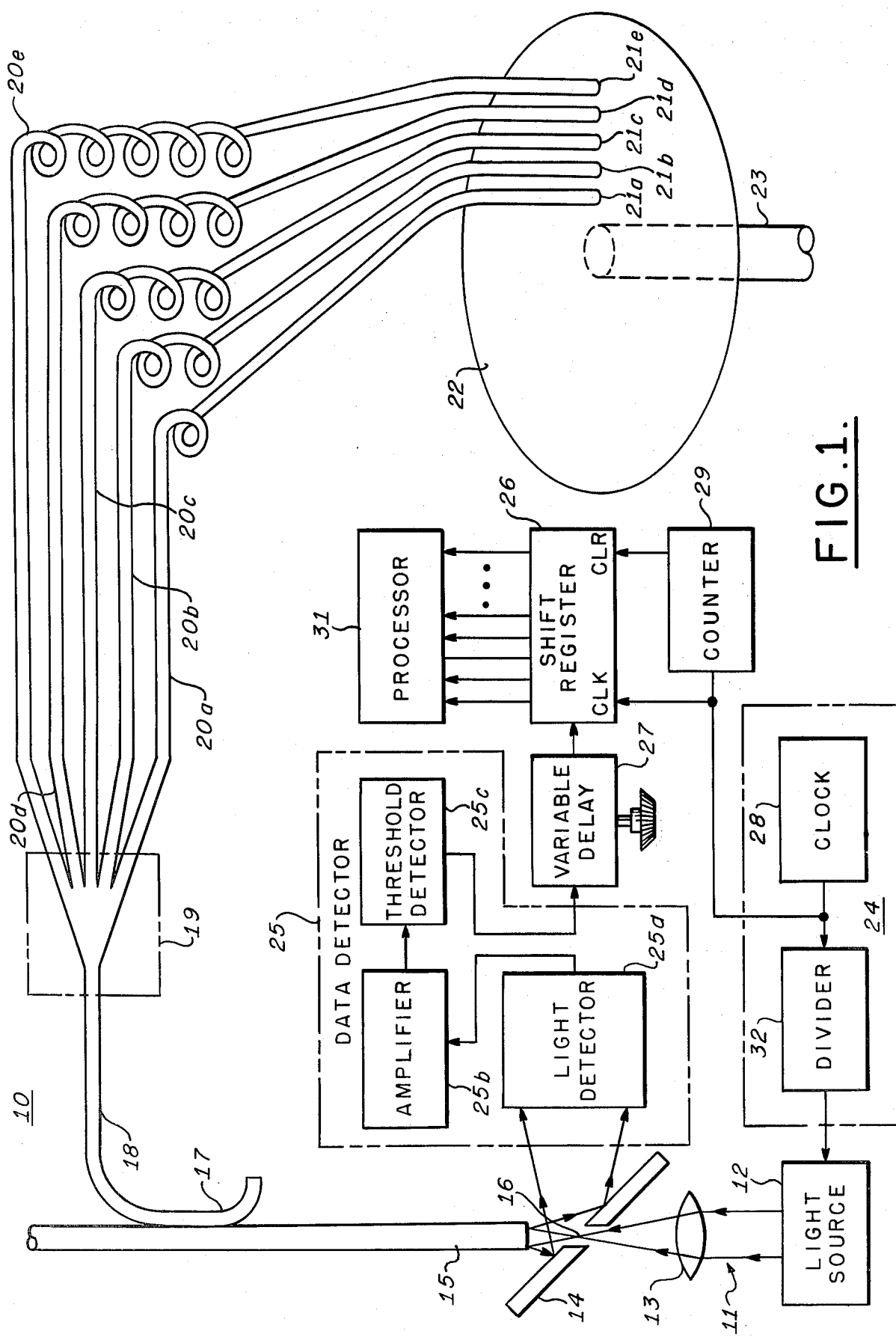
FIG. 1 is a schematic drawing of a preferred embodiment of the invention.
Figure 2:
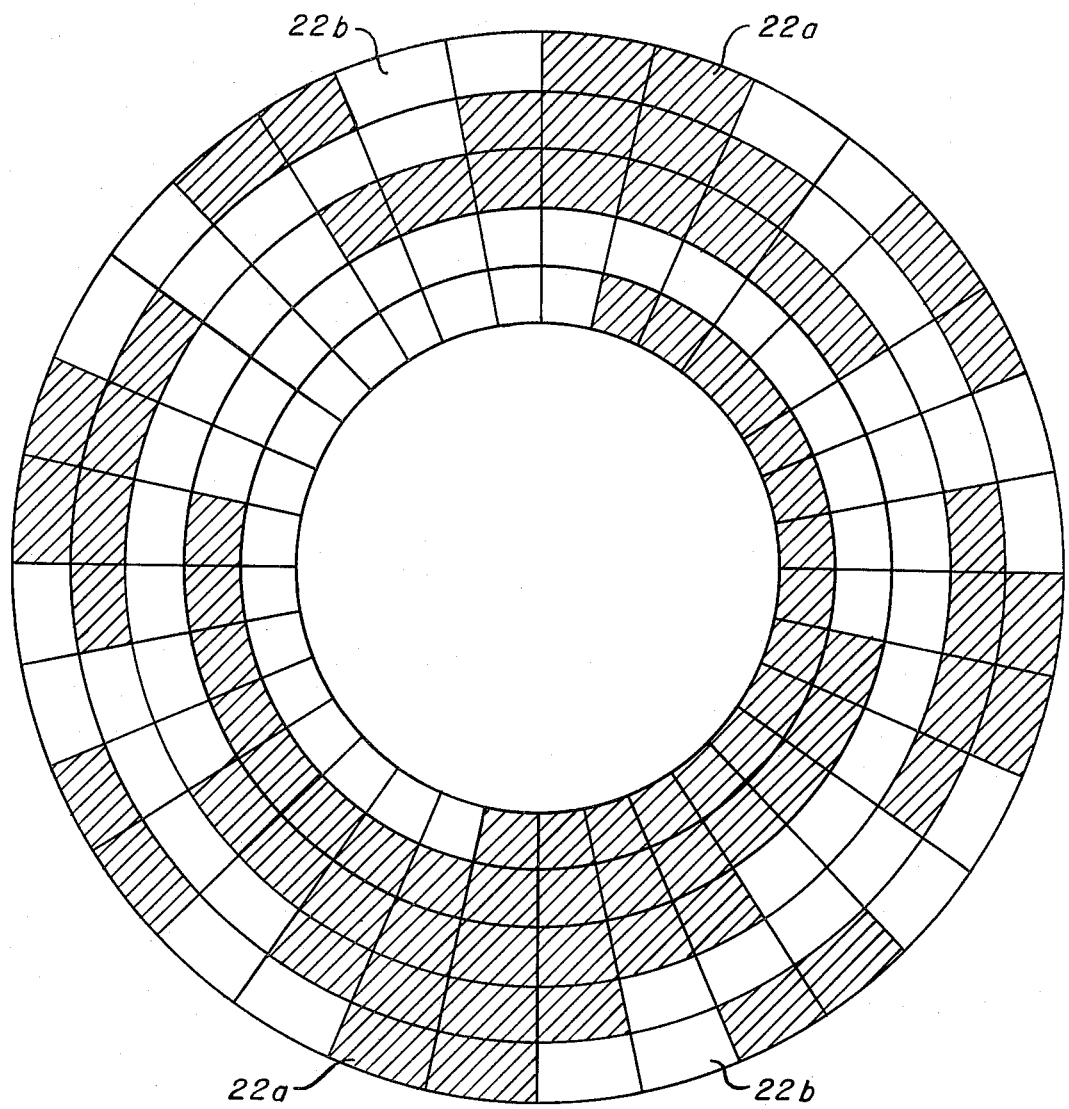
FIG. 2 is a representation of a rotational position code which may be utilized on a coded disc for angular position sensing.

An angle position sensor 10 utilizing fiber optics and the above described passive time division multiplexing is shown in FIG. 1. A light beam pulse 11 from a source 12, which may be a LED or a laser, may be incident to a focusing lens 13 to be focused through an aperture in a mirror 14 to be incident to an optical fiber having a numerical aperture corresponding to the divergence of the beam from the focus 16. A portion of the optical energy contained in the incident pulsed optical signal is coupled from the main optical transmission line 15 via optical directional coupler to an optical fiber 18. Optical directional coupler 17 may be of the type disclosed by Hill et al in a letter entitled "Efficient Power Combiner for Multiplexing Sources to Single Fiber Optical Systems" Applied Physics Letters, Vol. 31, December 1977. The remainder of the pulsed optical energy continues to propagate along optical fiber 15 and is available for branch coupling via couplers positioned at predetermined distances from the coupler 17. Fiber 18 is terminated with a transmitting star coupler 19, well known in the art, that distributes the pulsed optical energy between, for example, five optical fibers 20a through 20e. These five fibers, each of which have end faces of good optical quality positioned substantially perpendicular to the fiber axis, are of varying lengths which, for example, may be 2, 4, 6, 8, and 10 meters respectively. The end faces 21a through 21e are positioned adjacent to and facing the surface of a binary coded disc 22 to form a linear array. The binary code on the disc may be a Gray code and have a pattern of reflecting 22a and non-reflecting 22b areas arranged in concentric radial channels as shown in FIG. 2. Each fiber end face 21a through 21e is adjacent a different constant radius channel fo the binary coded disk. When a fiber end lies opposite a reflecting area 22a of the disk 22, a strong optical pulse signal is produced and when an end face is adjacent a relatively non-reflecting area 22b of the disk 22, a relatively weak or no return optical signal is produced.

Source 12 which may comprise a light emitting diode (LED) or a laser, is pulse modulated by a modulator 24 to emit a sequence of light pulses, the width of which is a function of the light velocity within the fiber and the desired time resolution. For fibers in which the velocity of light is $2 \times 10^8$ m/sec. and a two meter resolution required by the differential line lengths of the branch fibers 20a through 20e, for the example above given, this pulse width is in the order of 20 nanoseconds. The sequence of pulses from source 12 is focused by focusing lens 13 through the aperture of mirror 14 to be incident to the optical transmission line 15, wherefrom it is coupled through directional coupler 17 to an optical transmission line 18 to be coupled to the multiplicity of optical transmission lines 20a through 20e to propagate therealong to the end faces 21a through 21e. Light pulses emitted from the end faces 21a through 21e are either strongly or weakly reflected from the coding disk 22, dependent upon whether the end face is adjacent a highly reflecting area 22a or a weakly reflecting area 22b. The reflected optical pulses are coupled through the star coupler 19 to transmission line 18 and therefrom through directional coupler 17 to optical transmission line 15, wherefrom they are incident to mirror 16 and deflected to data detector 25 which provides electrical pulses corresponding to the incident optical pulses to establish a binary data stream. The electrical pulses so formed are coupled to a shift register 26 in the time sequence of arrival via a variable delay 27, the purpose of which is yet to be discussed.

Modulator 24 may include a clock 28 that is coupled to clock shift register 26, and through a counter 29, to provide a clear pulse for a shift register 26. The frequency of clock 28 is the reciprocal of the desired time resolution, which for the example under consideration is 50 MHz, thus providing a clock pulse to the shift register 26 every 20 nanoseconds to permit a continuous flow of data pulses generated by data detector 25, to enter the shift register 26. Data detector 25 may comprise a light detector 25a which is illuminated by pulsed optical signals deflected from the mirror 14 and provides electrical pulses representative thereof, an amplifier 25b which amplifies the electrical pulses coupled from the light detector 25a, and a threshold 25c detector which compares the amplified electrical pulses to a fixed threshold level and provides a pulse of a given amplitude for each electrical pulse that exceeds the threshold, thereby providing binary data for coupling to the shift register 26. Since the time delay between the star coupler terminating optical transmission line 18 and the incidence of the optical beam to the detector 25 may not be an integral multiple of a clock period, the data stream from the output of the detector 25 and the clock may not be in synchronism. This may be rectified by adjusting the variable delay 27 to provide the proper synchronization at the input terminal of shift register 26. The pulses from clock 28 are counted by counter 29 to provide a clearing pulse for shift register 26 at the conclusion of each data stream, which for the example of the 5 bit system shown would be after the fifth clock pulse coupled to shift register 26, as for example, the sixth pulse counted. To avoid system ambiguities, all the reflected pulses of an incident pulse from source 12 must be received prior to the coupling of the succeeding pulse from source 12 to the optical transmission line 15. The interpulse period of the modulator 24 must be greater than the maximum return time of the last pulse in the data stream. This may be accomplished by coupling the stream of pulses from clock 28 to divider 32 which may provide the next source trigger pulse at some time after the time of arrival of the last reflected pulse.

The position sensor described above is self-clocking by virtue of the production of a set of return pulses after a fixed time after the transmitted light pulse from the source 12. Self-clocking may also be achieved by positioning the end face of the shortest optical fiber of the multiplicity of optical fibers 20a through 20e adjacent to a band on the coded disk 22 which reflects light from all angular positions, thereby producing the first pulse return from the coded disk 22 for each transmitted pulse from optical source 12. This first pulse may then be employed to initiate the clocking of the shift register to enter subsequent pulses therein which occur at known time delays relative to this initial pulse.

Figure 3:
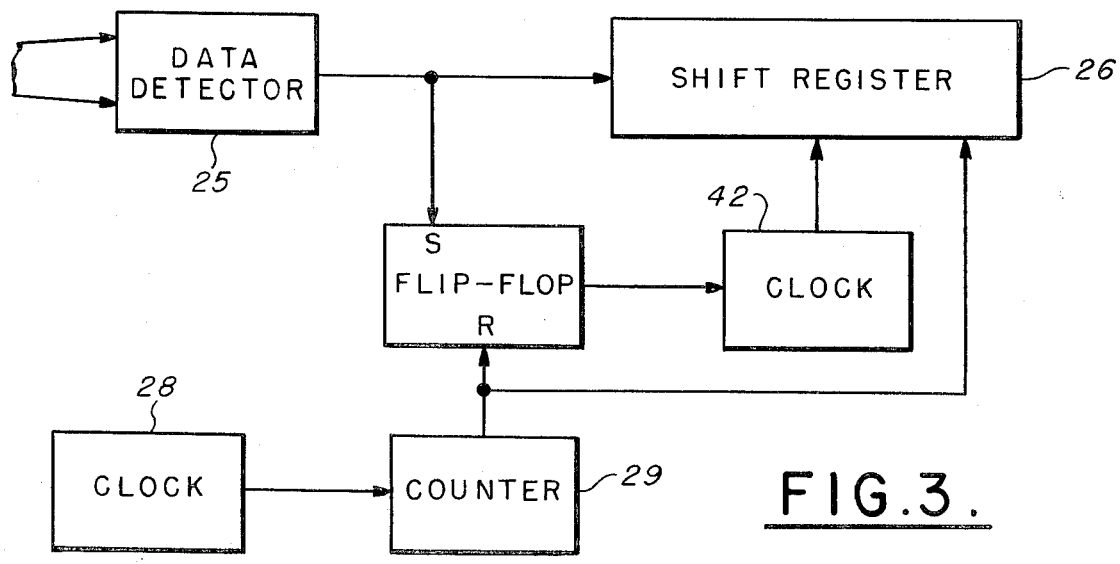
FIG. 3 is a block diagram of a time division demultiplexer useful in the embodiments of the invention.

Refer now to FIG. 3 wherein the electrical output signal of detector 25 is shown coupled to the shift register 26 and to a R-S flip flop 41. At the inception of the reflected first pulse of each transmitted pulsed optical signal from optical source 12, the set terminal of flip flop 41 couples an enable signal to a clock 42 which thereafter commences to clock data into shift register 26. As previously discussed, at a time after all reflected pulses of transmitted optical pulse from source 12 have been received, counter 29 provides a pulse to clear the shift register 26 and additionally is coupled to the reset terminal of flip flop 41.

Figure 4A:
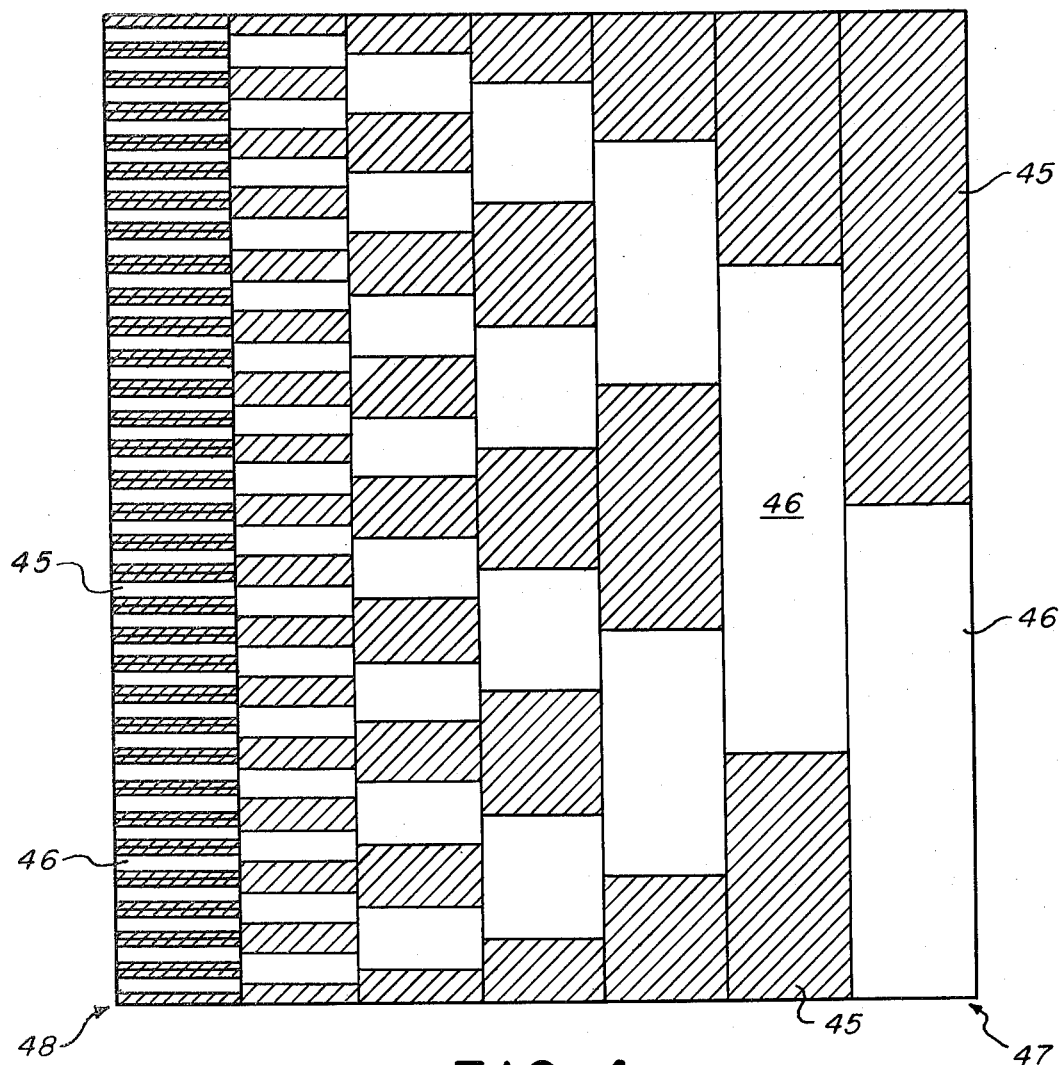
FIG. 4a is a representation of a linear position code which may be utilized for linear position sensing.
Figure 4B:
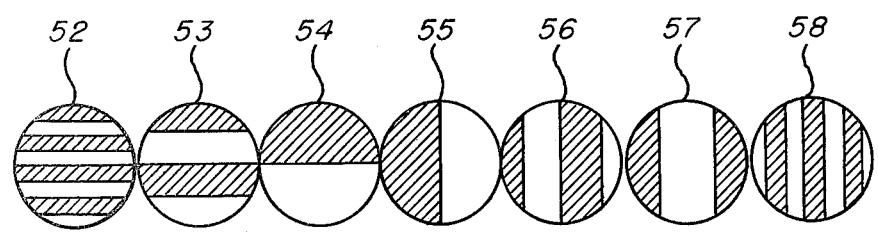
FIG. 4b is a representation of fiber end coding which may be utilized with the code of FIG. 4a to provide greater linear position sensitivity.

The embodiment shown in FIG. 1 may be converted from an angular position indicator to a linear position indicator by replacing the coded disk 22 with a coded linear translation stage pattern, an example of which is shown in FIG. 4, wherein the shaded portions 45 represent light reflecting areas and the non-shaded portions represent areas of substantially reduced reflection. Positional resolution for both the angle position and linear translation sensors is comparable to the core diameter of the fibers 20a through 20e, which may typically be between 2 and 8 mils. Greater positional accuracy may be obtained when the multiplicity of channels have a range of stripe widths that extend from much larger than a fiber diameter to much smaller than a fiber diameter, as represented in channels 47 and 48 respectively in FIG. 4A. As previously described, the fiber ends are positioned opposite the coded channel patterns, one fiber to a channel. The fiber end faces are unaltered for channels wherein the stripe widths are equal to or greater than a fiber diameter. In those channels wherein the stripes are smaller than the fiber diameter, the end faces are altered by applying parallel stripes "reflecting or non-reflecting" with widths that are substantially equal to the stripe width of the corresponding channel as shown in the fiber end face representations 52, 53, and 54 in FIG. 4B. The utilization of stripe patterns on the fiber end faces and in the coded channel permits the detection of motions that are comparable to the stripe width rather than the fiber diameter. Positional sensitivity with this dual striping is limited by how fine the striped patterns may be and still produce effective digital modulation of the reflected light signal. Defraction theory indicates that the limiting stripe width is in the order of a wave length of light; thus, an accuracy of about one micron (0.04 mils) is realizable.

All channels on the binary coded disk or linear stage pattern have alternating regions of high and low reflectivity. If the stripes on the fiber end faces are opaque and the stripes on the coded mask reflecting, for any position stage the reflected signal is zero or 50 percent of the incident light when the stripe widths are less than a fiber diameter and zero or 100 percent of the incident light when the stripe widths are equal to or greater than a fiber diameter. To provide substantially equal reflected signal variations for all channels, the fiber end faces in channels wherein the stripe widths are equal to or greater than the fiber diameter, may be striped with absorptive material in an orthogonal relationship with the coding stripes of the channel. Acceptable striping patterns to provide substantially equal reflected signal variations are shown in end face representations 55 through 58. This concept of striped patterns on the fiber end faces may also be utilized to provide a physically smaller sensing system with a resolution substantially equal to the resolution of a system employing uniformly clear fiber end faces.

Figure 5:
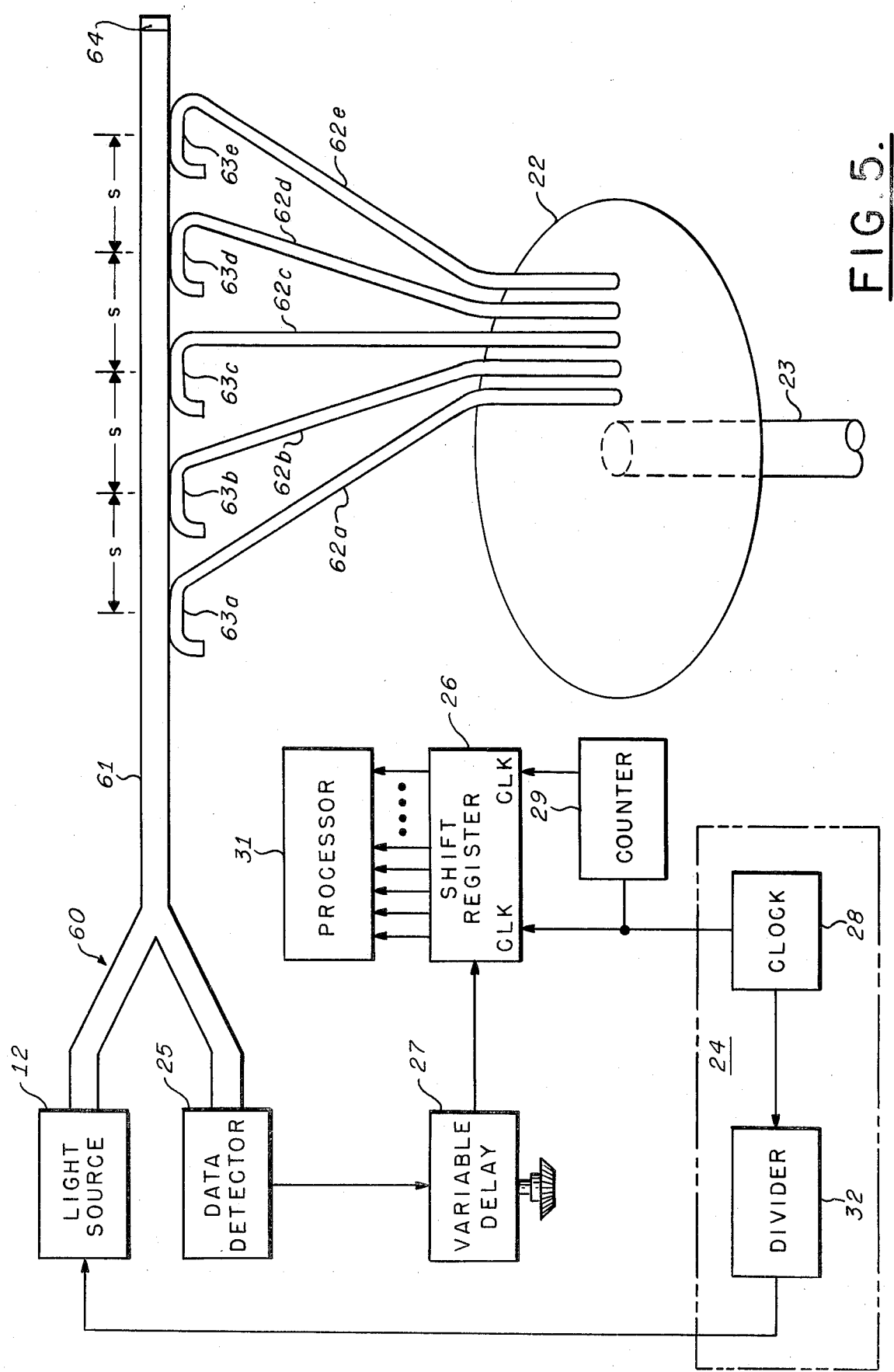
FIG. 5 is a schematic representation of a second preferred embodiment of the invention.

Referring to FIG. 5, light source 12 may be coupled via a "Y" coupler 60 to an optical transmission line 61 along which the inter-bit time delays previously described are accomplished by coupling a multiplicity of equal length optical fibers 62a through 62e thereto via directional couplers 63a through 63e positioned along the optical transmission line 62 with equal spacing "s" therebetween. This system operates substantially as the embodiments described in FIG. 1 with the coded optical pulse sequence incident to detector 25 via "Y" coupler 60 arriving at intervals that are substantially equal to 2s/V, where V is the velocity of light along the optical fiber 61. Optical fiber 61 may be terminated with a non-reflecting device 64 to prevent residual incident optical pulse energy from being reflected to form an additional pulse in the coded pulse sequence.

While the invention has been described in its preferred embodiments, it is to be understood that the words that have been used are words of description rather than of limitation and that changes within the purview of the appended claims may be made without departing from the true scope and spirit of the invention in its broader aspects.

I claim:

1. An optical digital position sensor comprising:
   main optical transmission means for propagating incident and reflected optical signals having a first terminal adapted to receive and to transmit optical signals;
   branch optical transmission means coupled to receive said incident optical signals from said main optical transmission means for propagating said received optical signals and reflected optical signals thereof to provide differential optical signal round trip time delays between said first terminal and end terminals of said branch optical transmission means; and
   code means having areas with a first reflection coefficient and areas with a second reflection coefficient, said areas illuminated by optical signals received from said main optical transmission means and emitted from said end terminals, each area thereafter returning an optical signal in accordance with the reflection coefficient positioned thereat to said branch optical transmission means wherefrom said reflected signals are coupled to said main optical transmission means to propagate to said first terminal thereby establishing a time sequence of optical signals thereat coded in accordance with said first and second reflection coefficients illuminated by said optical signals emitted from said end terminals.

2. An optical digital position sensor in accordance with claim 1 wherein said branch optical transmission means are coupled to said main optical transmission means through a star coupler having an input terminal coupled to said main optical transmission means and from which optical signals are coupled to branch optical transmission means, and said branch optical transmission means being of varying lengths to provide said round trip time delayed differences.

3. An optical digital position sensor in accordance with claim 1 wherein said branch optical transmission means are coupled to said main optical transmission means through optical directional couplers spaced along said main optical transmission means to provide said round trip time delayed differences.

4. An optical digital position sensor in accordance with claim 2 or 3 further including:
   detecting means coupled to receive reflected optical signals transmitted from said first terminal of said main optical transmission means for providing electrical signals representative thereof thereby establishing a time sequence of electrical signals;
   means coupled to said detecting means for storing said electrical signals; and
   means coupled to said storing means for processing said electrical signals.

5. An optical digital position sensor in accordance with claim 4 wherein said detecting means is coupled to receive said reflected signals by positioning reflecting means between said first terminal and said detecting means for deflecting said reflected optical signals to said detecting means.

6. An optical digital position sensor in accordance with claim 5 further including means coupled to said detecting means and said storing means for initiating storage of electrical signals upon the reception of the first electrical signal in said time sequence of electrical signals.

7. An optical position sensor in accordance with claim 4 wherein said receiving means includes a Y-coupler coupled at the common arm to said first terminal of said main optical transmission means, adapted at one branch arm to receive optical signals and coupled at the other branch arm to said detecting means.

* * * * *